US006807104B2

(12) United States Patent
Arai et al.

(10) Patent No.: US 6,807,104 B2
(45) Date of Patent: Oct. 19, 2004

(54) NONVOLATILE SEMICONDUCTOR MEMORY DEVICE AND DATA PROGRAM METHOD THEREOF

(75) Inventors: Fumitaka Arai, Yokohama (JP); Akira Shimizu, Oyama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/700,508

(22) Filed: Nov. 5, 2003

(65) Prior Publication Data

US 2004/0141377 A1 Jul. 22, 2004

(30) Foreign Application Priority Data

Nov. 29, 2002 (JP) ..................................... 2002-347799

(51) Int. Cl.$^7$ ............................................. G11C 16/04
(52) U.S. Cl. ........................... 365/185.24; 365/185.03; 365/185.22
(58) Field of Search .................. 365/185.22, 185.23, 365/185.24, 185.03

(56) References Cited

U.S. PATENT DOCUMENTS

| 5,555,204 A | | 9/1996 | Endoh et al. | |
|---|---|---|---|---|
| 5,903,495 A | * | 5/1999 | Takeuchi et al. | ........ 365/185.03 |
| 6,046,935 A | * | 4/2000 | Takeuchi et al. | ........ 365/185.03 |
| 6,134,140 A | | 10/2000 | Tanaka et al. | |
| 6,208,560 B1 | | 3/2001 | Tanaka et al. | |
| 6,222,763 B1 | * | 4/2001 | Sato et al. | ............. 365/185.03 |
| 6,243,290 B1 | * | 6/2001 | Kurata et al. | .......... 365/185.03 |
| 6,314,026 B1 | | 11/2001 | Satoh et al. | |
| 6,434,055 B2 | | 8/2002 | Tanaka et al. | |
| 6,459,612 B2 | | 10/2002 | Satoh et al. | |
| 6,493,265 B2 | | 12/2002 | Satoh et al. | |
| 6,549,464 B2 | | 4/2003 | Tanaka et al. | |

FOREIGN PATENT DOCUMENTS

| JP | 7-169284 | 7/1995 |
|---|---|---|
| JP | 8-87895 | 4/1996 |

* cited by examiner

Primary Examiner—Gene N. Auduong
(74) Attorney, Agent, or Firm—Oblon, Spivak, McClelland, Maier & Neustadt, P.C.

(57) ABSTRACT

A nonvolatile semiconductor memory device includes cell transistors connected to a plurality of wirings, word lines each commonly connected to the gate electrodes of those of the cell transistors which are arranged on a corresponding row, and driving circuits respectively connected to the plurality of wirings. The driving circuit includes a detection circuit which detects threshold voltage of the cell transistor in a verify operation, a storage circuit which stores threshold voltage detected and a potential setting circuit which sets potential of the wiring to at least three potentials based on the threshold voltage stored in the storage circuit in a program operation following the verify operation.

32 Claims, 14 Drawing Sheets

V1: VBLpgm
V2: VBLpgm+ΔVpgm
V3: VBLinhibit
V4: VBLread

Program state

Program suppression state

Program inhibition state

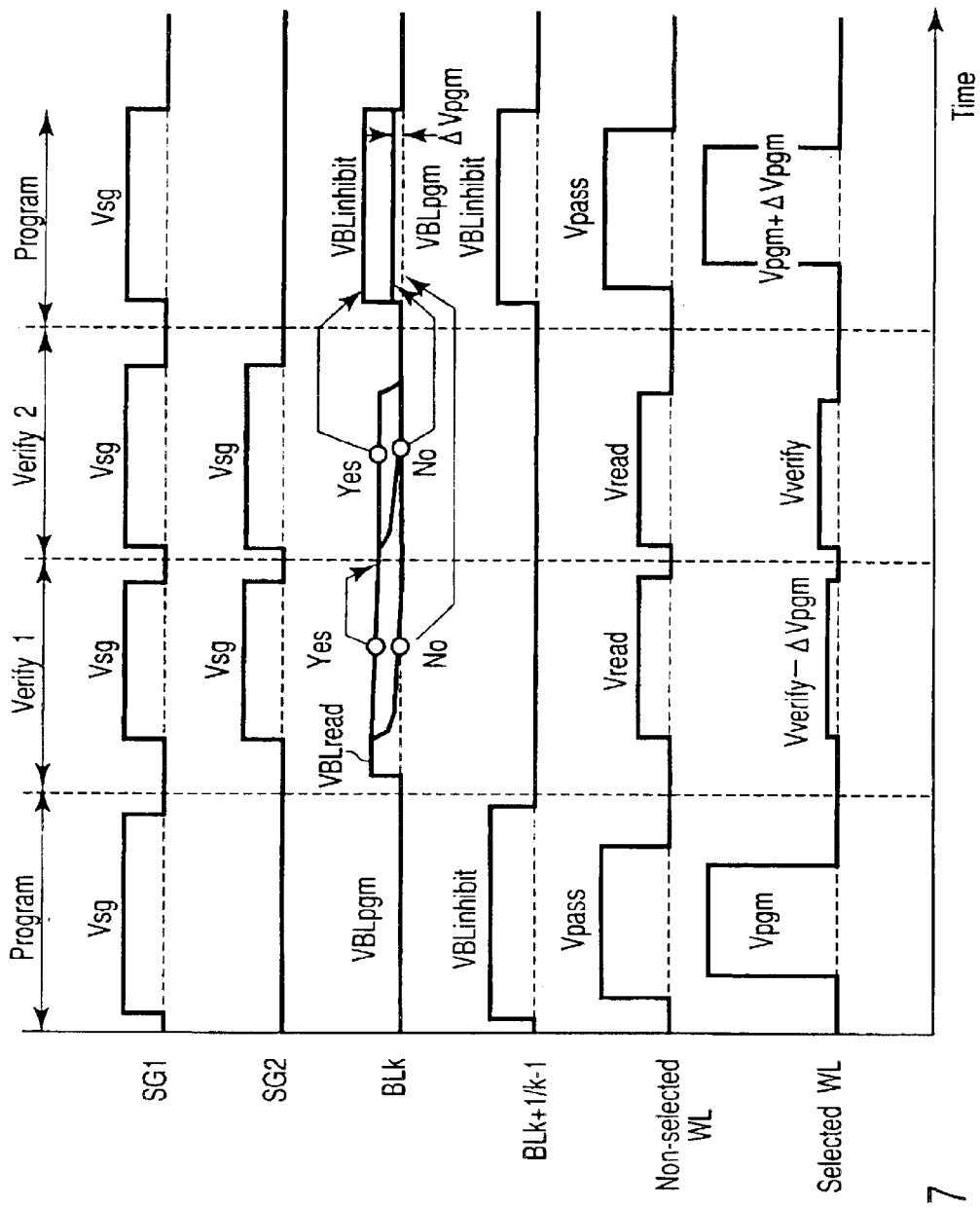
F I G. 7

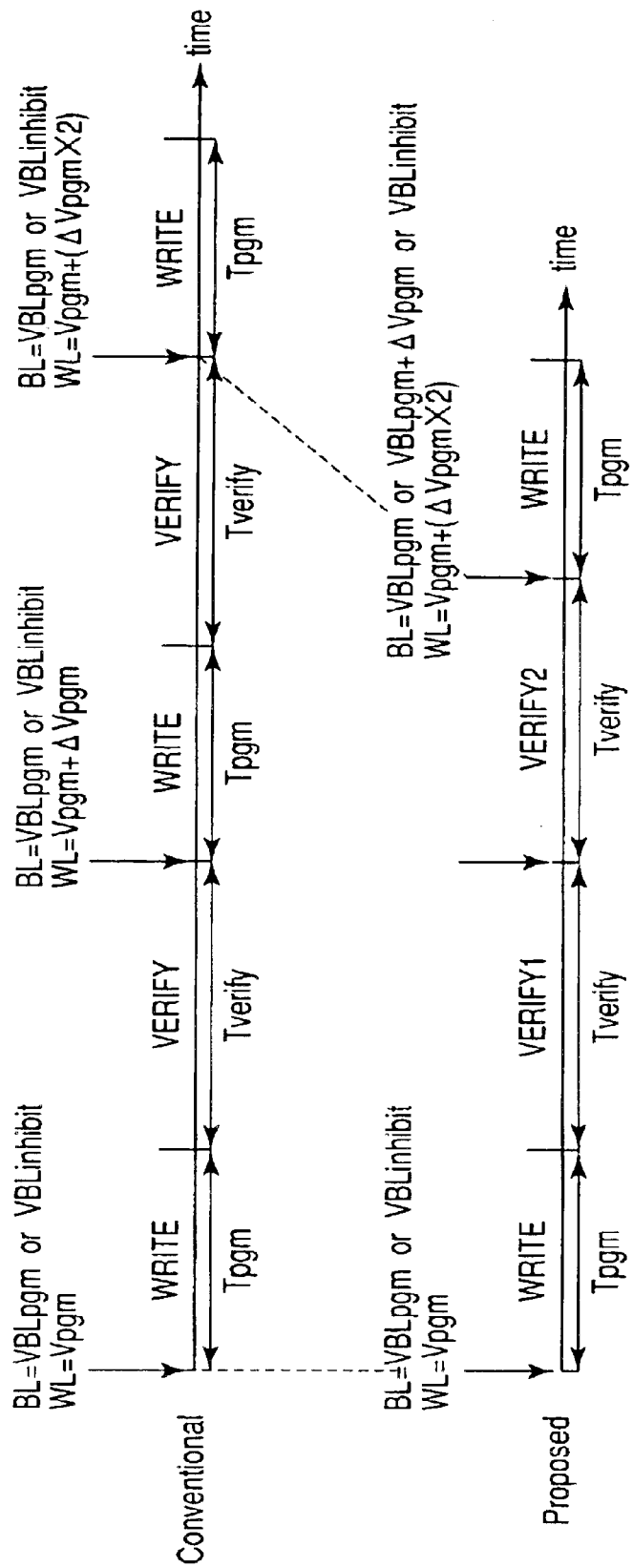
F I G. 10

V1: VBLpgm
V2: VBLpgm+ΔVpgm
V3: VBLinhibit
V4: VBLread

NONVOLATILE SEMICONDUCTOR MEMORY DEVICE AND DATA PROGRAM METHOD THEREOF

CROSS-REFERENCE TO RELATED APPLICATIONS

This application is based upon and claims the benefit of priority from the prior Japanese Patent Application No. 2002-347799, filed Nov. 29, 2002, the entire contents of which are incorporated herein by reference.

BACKGROUND OF THE INVENTION

1. Field of the Invention

This invention relates to a nonvolatile semiconductor memory device and a method of programming data into the nonvolatile semiconductor memory device.

2. Description of the Related Art

An electrical connection diagram of a typical NAND EEPROM is shown in FIG. 1. The NAND EEPROM includes NAND cells as memory cells. The NAND cell is configured by serially connecting cell transistors with the sources of the cell transistors respectively connected to the drains of the adjacent cell transistors. In the NAND cell, since the adjacent cell transistors commonly use the source and drain, the number of contacts between the cells and bit lines can be reduced and it is suitable for high integration. Further, since the gates of a large number of cell transistors are simultaneously driven via a word line WL, data can be programmed into or read out from a large number of cell transistors at high speed.

On the other hand, in the NAND EEPROM, all of the non-selected cell transistors in the NAND cell must be turned ON in order to read out data from a selected cell transistor. Therefore, the threshold voltage of each cell transistor is controlled to be set within a preset range. For example, if the threshold voltage is excessively low, the cell transistor cannot be separated from the non-programmed cell. However, if the threshold voltage is excessively high, the cell transistor cannot be turned ON when it is used as a non-selected cell.

As one example of a method for controlling the threshold voltage of the cell transistor, the flow of a programming method with the verify operation is shown in FIG. 2. After the program operation is performed by applying program gate potential (Vpgm) to the word line WL, the readout operation is performed by applying verify readout gate potential (Vverify) to the word line WL. At this time, sufficiently high readout gate potential (Vread) is applied to the non-selected word lines WL which are not used for data programming to set the non-selected cell transistors in the ON state. In this state, when the selected cell transistor is turned ON, it is determined that the threshold voltage of the cell transistor is excessively low, that is, a programmed amount is insufficient. Then, Vpgm is raised by a preset amount ($\Delta$Vpgm) and a next program operation is performed. The above technique is called a step-up program technique and described in documents 1 to 3, for example. On the other hand, when the selected cell transistor is turned OFF, it can be determined that the threshold voltage of the cell transistor is made sufficiently high and the program operation is terminated. Since the actual program operation is simultaneously performed for a large number of cell transistors via a word line WL, termination of the program operation indicates that the operation mode is changed into a program inhibition state which will be described later.

FIG. 3 shows an example of a time chart at the data programming time of the NAND EEPROM. In FIG. 3, the names of respective nodes correspond to those of FIG. 1. Assume that the bit line BLk in FIG. 1 is used as a program bit line and the bit lines BLk+1, BLk−1 are used as program suppression bit lines. At the program time, preset gate potential (Vsg) is applied to the gate of a selection transistor SG1 on the bit line side. Then, sufficiently low potential (VBLpgm) is applied to the bit line BLk used for programming. Vsg is set to such potential with respect to VBLpgm as to sufficiently turn ON the selection transistor SG1. Further, sufficiently high potential (VBLinhibit) is applied to the bit lines BLk+1, BLk−1 used to inhibit the program operation. VBLinhibit is set to such potential as to sufficiently turn OFF the selection transistor SG1. When VBLpgm is applied to the bit line, the selection transistor SG1 is turned ON to transmit VBLpgm to the cell transistor to sufficiently lower the channel potential of the cell transistor so that the program operation can be performed. When VBLinhibit is applied to the bit line BL, the selection transistor SG1 is turned OFF and the channel potential of the cell transistor is not lowered so that the program operation cannot be performed. This state is the program inhibition state.

At the first program time, after VBLpgm is applied to the bit line BLk connected to the cell transistor to be programmed and VBLinhibit is applied to the bit lines BLk+1, BLk−1 connected to the cell transistors which are inhibited from being programmed, Vpgm is applied to the word line WL. Next, after the bit line BL is charged to preset initial charged potential, Vverify is applied to the word line WL to perform the verify readout operation. When the cell transistor is turned ON and the bit line BL is discharged, a programmed data amount is insufficient, and therefore, the program operation is performed in a next program process. When the cell transistor is turned OFF and the bit line BL is not discharged, a programmed data amount is sufficient, and therefore, the potential of the bit line BL is set to VBLinhibit to set up the program inhibition state in a next program process. The potential of the word line WL is increased to Vpgm+$\Delta$Vpgm to perform an additional program operation with respect to the cell transistor which is determined to have an insufficient programmed data amount. Thus, the verify operation for the threshold voltage of the cell transistor is performed after the program operation and the control operation is performed to determine whether the program operation is performed or inhibited in the next program process based on the result of the verify operation. The above operations are repeatedly performed until the program operations for all of the cell transistors are terminated while the potential of the word line WL is gradually increased. As a result, the threshold voltage of the cell transistor is controlled to be set within a desired range. That is, the lowest threshold voltage of the cell transistor is set to Vverify and the threshold voltage distribution range obtained after the end of the program operation is determined by $\Delta$Vpgm. Therefore, if Vverify is set sufficiently high with respect to the cell which is not to be programmed and Vverify+$\Delta$Vpgm is set sufficiently low with respect to Vread, desired threshold voltage distribution can be attained. A variation in the threshold voltage distribution at the program time of the cell transistor is shown in FIG. 4.

In FIG. 4, if a program characteristic variation of the cell transistor is Wvt, the following conditions must be satisfied in order to attain desired threshold voltage distribution.

First program WL potential: the cell which is programmed at the highest speed is not programmed with voltage equal to or higher than Vverify+$\Delta$Vpgm.

Last program WL potential: the cell which is programmed at the lowest speed is programmed with voltage equal to or higher than Vverify.

During the program operation, it is necessary to increase the program WL potential by the unit of $\Delta Vpgm$, and if the number of program operations to perform the program operations for all of the cell transistors is Nloop, then Nloop is expressed as follows.

$$Nloop \geq Wvt/\Delta Vpgm$$

As indicated by the above expression, the number Nloop of program operations becomes larger as the program characteristic variation Wvt of the cell transistor becomes larger. The program characteristic variation Wvt becomes larger as the device is further miniaturized. Therefore, there will occur a problem that the program speed is lowered with the development of miniaturization.

Further, the number Nloop of program operations decreases with a reduction of $\Delta Vpgm$. If $\Delta Vpgm$ is reduced, the threshold voltage distribution range of the cell transistor can be finely and precisely controlled. This technique is useful for a multi-value memory and a reduction in the readout potential Vread, for example. For example, the multi-value memory has an order of plural data items in a potential range equal to or lower than the readout potential Vread. Therefore, it is necessary to more finely and precisely control the threshold voltage distribution range of the cell transistors in the multi-value memory in comparison with a binary memory. If an attempt is thus made to finely and precisely control the threshold voltage distribution range of the cell transistors, the number Nloop of program operations increases and the program speed is lowered.

Document 1: Jpn. Pat. Appln. KOKAI Publication No. 7-169284

Document 2: U.S. Pat. No. 5,555,204

Document 3: G. J. Hemink, T. Tanaka, T. Endoh, S. Aritome, and R. Shirota, "Fast and accurate programming method for multilevel NAND flash EEPROM's", in SYMP. VLSI Technology Dig. Tech. Papers, June 1995, pp. 129–130.

BRIEF SUMMARY OF THE INVENTION

A nonvolatile semiconductor memory device according to a first aspect of the present invention comprises a plurality of wirings formed to extend in a first direction; memory cells containing nonvolatile memory cell transistors and connected to the plurality of wirings; word lines commonly connected to gate electrodes of the nonvolatile memory cell transistors arranged along a second direction which intersects the first direction; and driving circuits respectively connected to the plurality of wirings, each of the driving circuits including a detection circuit which detects threshold voltage of the nonvolatile memory cell transistor in a verify operation, a storage circuit which stores threshold voltage detected by the detection circuit and a potential setting circuit which sets potential of the wiring to at least three potentials in a program operation following the verify operation based on the threshold voltage stored in the storage circuit.

A data programming method of a nonvolatile semiconductor memory device according to a second aspect of the present invention comprises programming data into a nonvolatile memory cell transistor, verifying threshold voltage of the nonvolatile memory cell transistor into which data has been programmed, setting potential of a bit line to program inhibition potential used to inhibit data programming if it is detected based on the result of verification that a sufficient amount of data has been programmed, and setting the potential of the bit line to at least one program suppression potential which lies between the program inhibition potential and the program potential and is used to program data while suppressing a program amount or program potential used to program data according to the threshold voltage of the nonvolatile memory cell transistor and additionally programming data into the nonvolatile memory cell transistor if it is detected based on the result of verification that a sufficient amount of data has not been programmed.

BRIEF DESCRIPTION OF THE SEVERAL VIEWS OF THE DRAWING

FIG. 7 is an operation waveform diagram showing a first example of operation waveforms of the nonvolatile semiconductor memory device according to the first embodiment of this invention.

FIG. 10 is a diagram showing a program operation in the first embodiment of this invention in comparison with a typical program operation.

DETAILED DESCRIPTION OF THE INVENTION

There will now be described embodiments of this invention with reference to the accompanying drawings. When explaining this invention, common portions are denoted by the same reference symbols throughout the drawings.

First Embodiment

First, the program operation which a nonvolatile semiconductor memory device according to a first embodiment of this invention performs is explained. FIGS. 5A to 5D are diagrams showing one example of a potential control operation which the nonvolatile semiconductor memory device according to the first embodiment of this invention performs at the program operation time.

Figure 1:
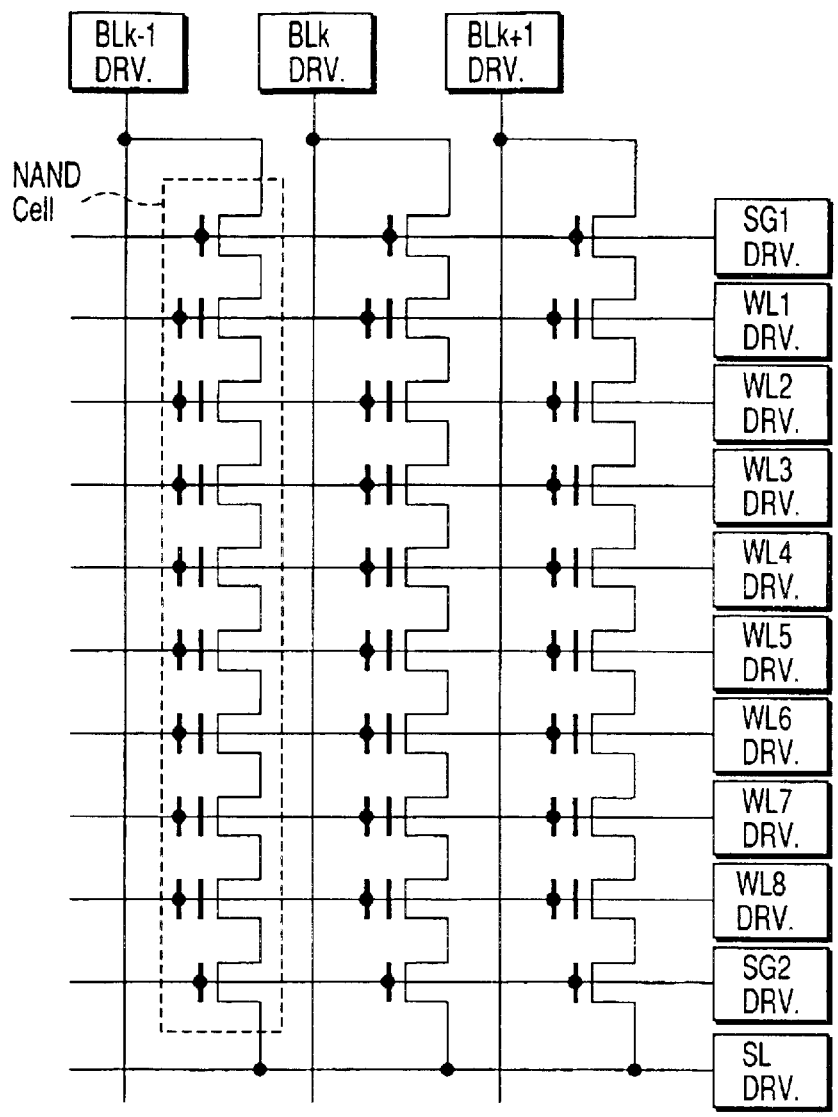
FIG. 1 is a block diagram showing a nonvolatile semiconductor memory device according to a typical (conventional) example.
Figure 2:
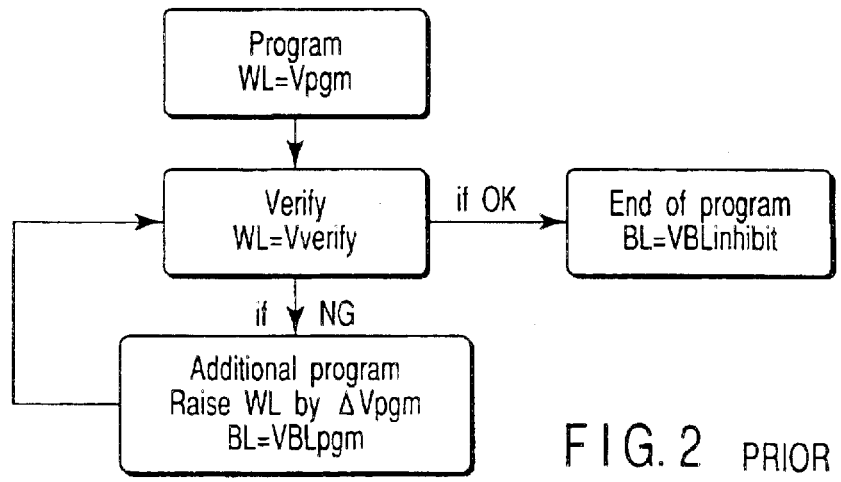
FIG. 2 is a flow diagram showing the verify operation which the nonvolatile semiconductor memory device according to the typical example performs.
Figure 3:
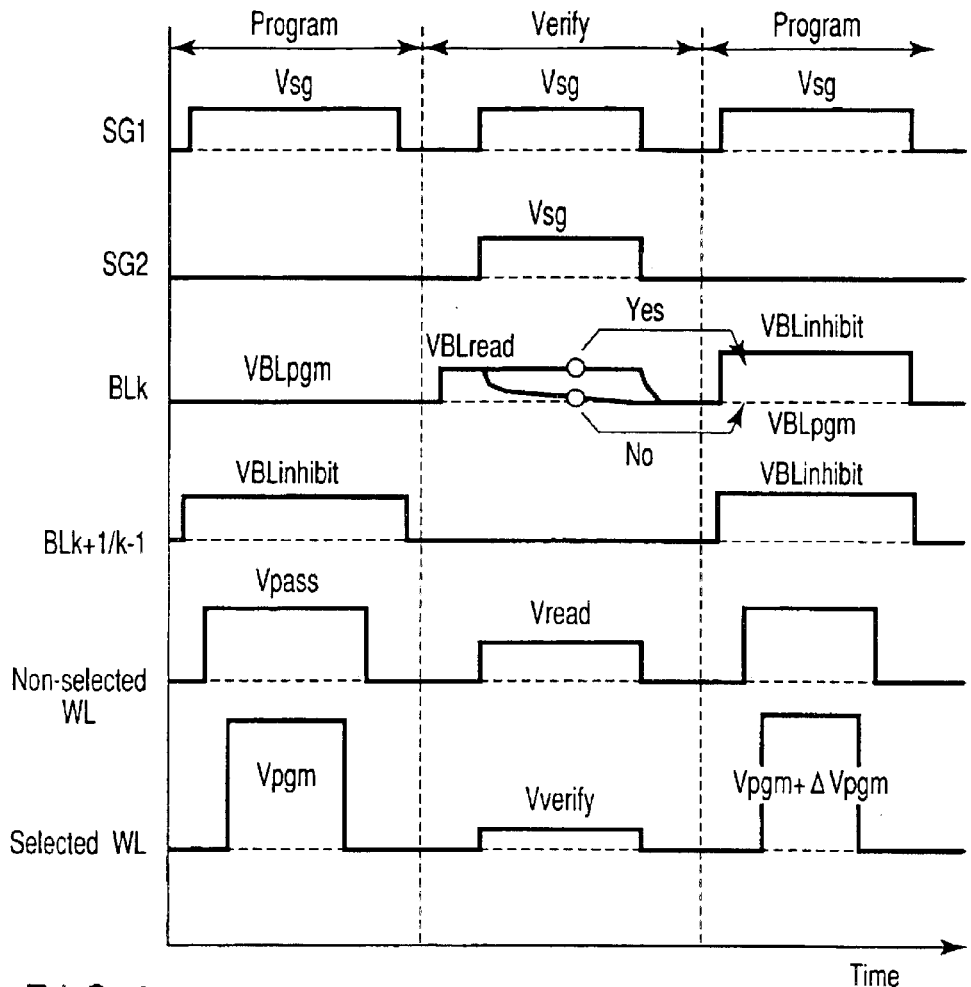
FIG. 3 is an operation waveform diagram showing operation waveforms of the nonvolatile semiconductor memory device according to the typical example.
Figure 4:
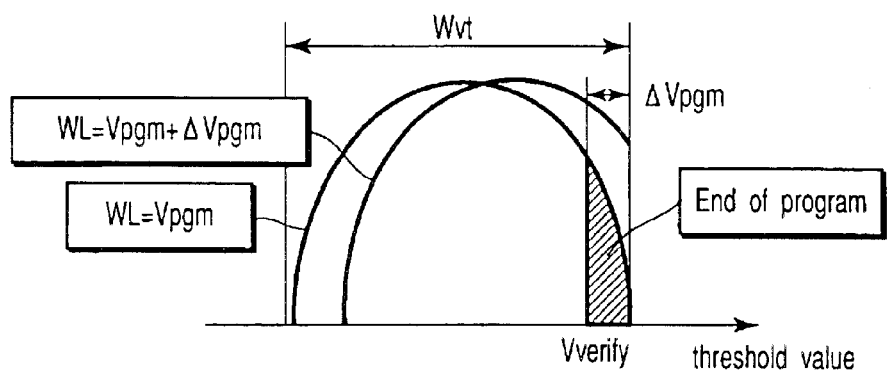
FIG. 4 is a diagram showing the threshold voltage distributions before and after the verify operation.
Figure 5A:
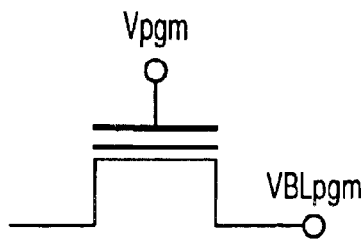
FIGS. 5A, 5B, 5C and 5D are diagrams showing one example of a potential control operation which a nonvolatile semiconductor memory device according to a first embodiment of this invention performs.

FIG. 5A shows a case wherein program potential (VBLpgm) is applied to a bit line BL and program gate potential (Vpgm) is applied to a word line WL to program data into a selected cell transistor (which is hereinafter referred to as a selected cell). At this time, VBLpgm is set sufficiently lower than the gate potential (Vsg) of a selection transistor SG1 on the bit line side. Therefore, the selection transistor SG1 is set into the ON state to lower the channel potential of the selected cell to VBLpgm and data is programmed into the selected cell until threshold voltage determined by Vpgm can be attained. Next, after the threshold voltage of the selected cell is verified by the verify operation, the potential of the word line WL is increased by a preset amount (ΔVpgm×2) and a next program operation is started. In the first embodiment, three states are selectively set as the program state in the next program operation.

(i) Program State

Figure 5B:
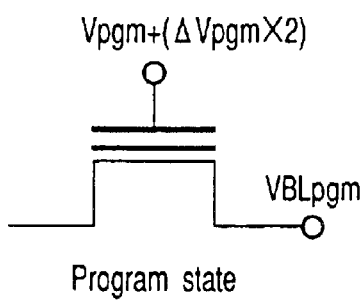

The program potential VBLpgm is applied to the bit line BL and stepped-up program gate potential Vpgm+(ΔVpgm×2) is applied to the word line WL. In this case, the same program operation as in the preceding cycle is performed with respect to the selected cell and the threshold voltage thereof is increased by an increased amount of the word line potential, that is, ΔVpgm×2. The state is shown in FIG. 5B.

(ii) Program Suppression State

Figure 5C:
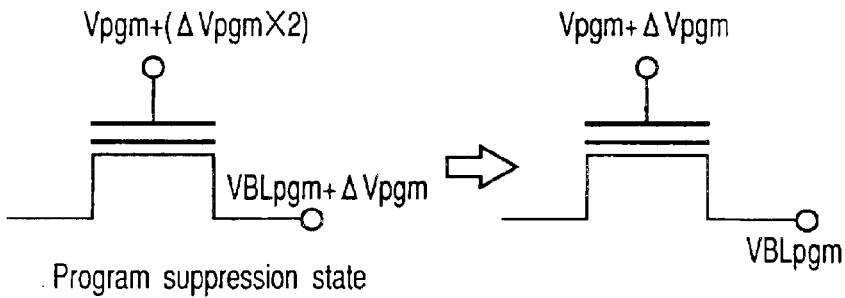

Program suppression potential VBLpgm+ΔVpgm is applied to the bit line BL and the stepped-up program gate potential Vpgm+(ΔVpgm×2) is applied to the word line WL. At this time, VBLpgm+ΔVpgm and Vsg are set so as to set the selection transistor SG1 on the bit line side into the sufficient ON state. In this case, the program operation is performed for the selected cell and potential which is higher than that in the case (i) by ΔVpgm×2−ΔVpgm=ΔVpgm is transferred to the channel of the selected cell. Therefore, an amount of ΔVpgm among the increased amount of ΔVpgm×2 of the word line potential is cancelled, and as a result, the threshold voltage of the selected cell is increased by ΔVpgm. The state is shown in FIG. 5C.

(iii) Program Inhibition State

Figure 5D:
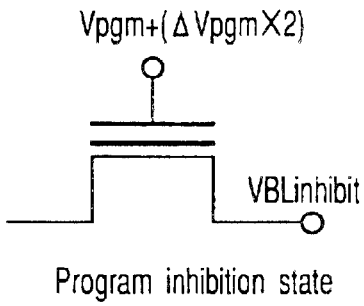

Program inhibition potential VBLinhibit is applied to the bit line BL and the stepped-up program gate potential Vpgm+(ΔVpgm×2) is applied to the word line WL. At this time, the selection transistor SG1 on the bit line side is set into the OFF state, the channel potential of the selected cell is not lowered and the program operation is not performed. As a result, the threshold voltage of the selected cell is not increased. The state is shown in FIG. 5D.

By selectively setting the three program states (i) to (iii), three results of "ΔVpgm×2", "ΔVpgm", "no increase" can be expected with respect to an increase. in the threshold voltage of the selected cell.

Figure 6:
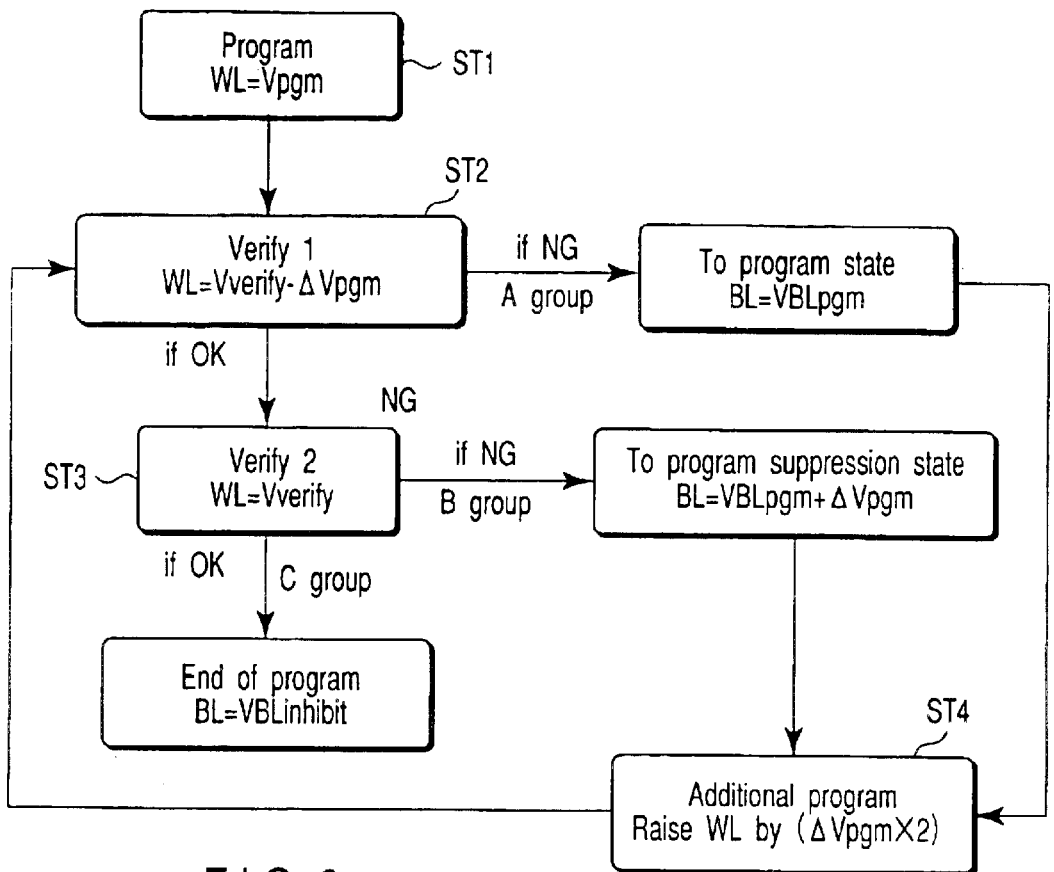
FIG. 6 is a flow diagram showing a first example of a verify operation which the nonvolatile semiconductor memory device according to the first embodiment of this invention performs.

Next, a first example of the verify operation performed during the above program operation is explained. FIG. 6 is a flow diagram showing a first example of a verify operation which the nonvolatile semiconductor memory device according to the first embodiment performs.

As shown in FIG. 6, first, the potential of the word line WL is set to Vpgm and data is programmed into a selected cell (ST.1).

Assume that the lowest threshold voltage which the selected cell must satisfy after the end of the program operation is Vverify. In this case, the potential of the word line WL is set to (Vverify−ΔVpgm) and data is read out from the selected cell (ST.2: verify 1). Assume that the selected cell is turned ON and the potential of the bit line BL is lowered as the result of readout. Cells which cause the potential of the bit line BL to be lowered are classified into an "A" group (if NG). The threshold voltage of the cell in the "A" group is lower than (Vverify−ΔVpgm).

Next, the potential of the word line WL is set to Vverify and data is read out from the selected cell (ST.3: verify 2). At this time, a current flows in the selected cell and cells which cause the potential of the bit line BL to be lowered and are not contained in the "A" group are classified into a "B" group (if NG). The threshold voltage of the cell in the "B" group is higher than (Vverify−ΔVpgm) and lower than Vverify. Remaining cells which are not contained in the "A" and "B" groups are classified into a "C" group. The threshold voltage of the cell in the "C" group is equal to or higher than Vverify. After this, the potential of the word line WL is increased by ΔVpgm×2 and an additional program operation is performed (ST.4: additional program). At the time of additional program, the cells in the "A", "B", "C" groups are respectively set to correspond to the states (i), (ii), (iii). The states before and after the additional program operation are summarized as follows.

"A" Group . . . (i) Program State:
 The threshold voltage before the additional program operation is not higher than (Vverify−ΔVpgm)
 An increase in the threshold voltage during the additional program operation is ΔVpgm×2
 The threshold voltage after the additional program operation is not higher than (Vverify+ΔVpgm)
 The threshold voltage range which can be controlled in the additional program operation is ΔVpgm×2

"B" Group . . . (ii) Program Suppression State:
The threshold voltage before the additional program operation is equal to or higher than (Vverify−ΔVpgm) and lower than Vverify
An increase in the threshold voltage during the additional program operation is ΔVpgm
The threshold voltage after the additional program operation is equal to or higher than Vverify and equal to or lower than (Vverify+ΔVpgm)
The threshold voltage range which can be controlled in the additional program operation is ΔVpgm
"C" Group . . . (iii) Program Inhibition State:
The threshold voltage before the additional program operation is equal to or higher than Vverify
There is no increase in the threshold voltage during the additional program operation
The threshold voltage after the additional program operation is maintained in the state set before the additional program operation Examples of operation waveforms according to the potential control operation at the program operation time and the verify operation in the first example are shown in FIG. 7.

Figure 8:
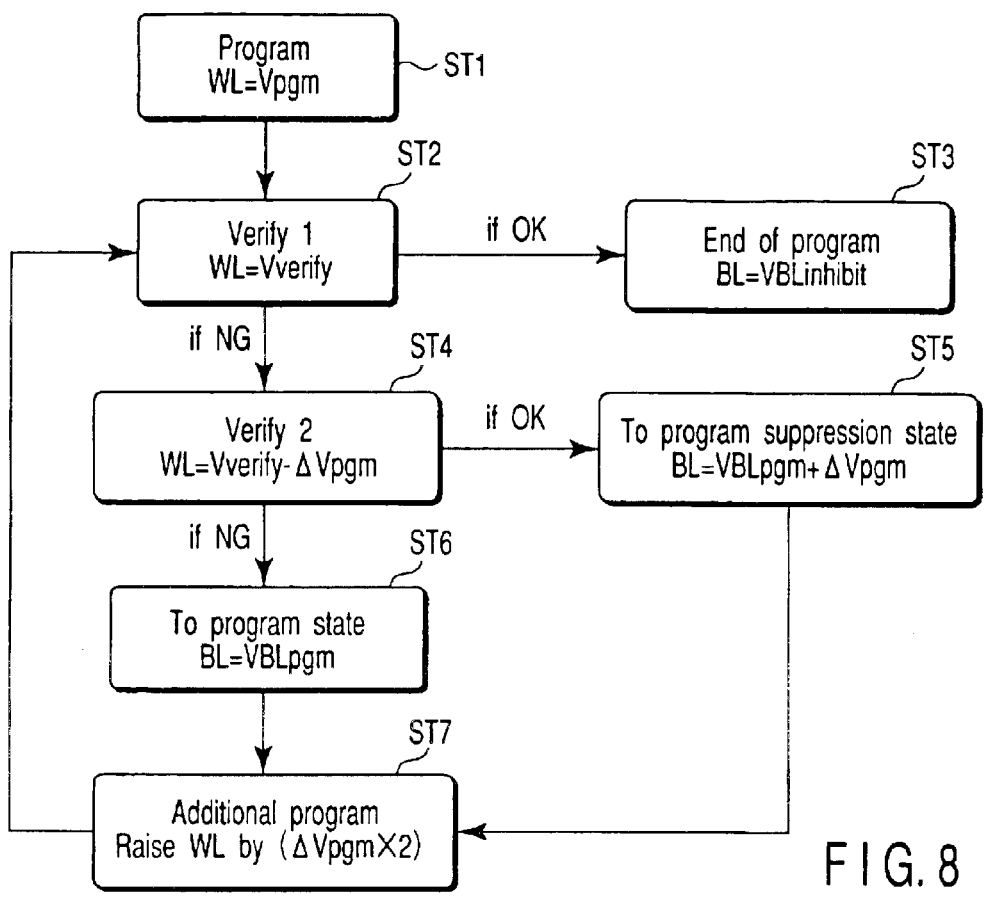
FIG. 8 is a flow diagram showing a second example of the verify operation which the nonvolatile semiconductor memory device according to the first embodiment of this invention performs.

Next, a second example of the verify operation is explained. FIG. 8 is a flow diagram showing a second example of the verify operation which the nonvolatile semiconductor memory device according to the first embodiment performs. In the first example, the three program states (i) to (iii) are determined by setting the potential of the word line WL to (Vverify−ΔVpgm) to perform the verify operation and then setting the potential of the word line WL to Vverify to perform the verify operation again. The three program states (i) to (iii) can also be determined by setting the potential of the word line WL to Vverify to perform the verify operation and then setting the potential of the word line WL to (Vverify−ΔVpgm) to perform the verify operation again. The second example corresponds to the latter case.

As shown in FIG. 8, first, the potential of the word line WL is set to Vpgm and data is programmed into a selected cell (ST.1).

After the end of the program operation, the potential of the word line WL is set to Vverify and data is read out from the selected cell (ST.2: verify 1). As the result of readout, if the selected cell is turned OFF to prevent the bit line BL from being discharged, it is determined that the threshold voltage before the additional program operation is equal to or higher than Vverify (if OK). Then, the potential of the bit line BL is set to VBLinhibit (ST.3: end of program operation). If the selected cell is turned ON and the bit line BL is discharged, the potential of the bit line BL is set depending on the result of the next readout operation (if NG).

Next, the potential of the word line WL is set to (Vverify−ΔVpgm) and data is read out from the selected cell (ST.4: verify 2). As the result of readout, if the selected cell is turned OFF to prevent the bit line BL from being discharged, it is determined that the threshold voltage before the additional program operation is equal to or higher than (Vverify−ΔVpgm) and lower than Vverify (if OK). Then, the potential of the bit line BL is set to (VBLpgm+ΔVpgm) (ST.5: to program suppression state). If the selected cell is turned ON and the bit line BL is discharged, it is determined that the threshold voltage before the additional program operation is equal to or lower than (Vverify−ΔVpgm) (if NG) and the potential of the bit line BL is set to VBLpgm (ST.6: to program state). After this, the potential of the word line WL is increased by ΔVpgm×2 and the additional program operation is performed (ST.7: additional program).

Figure 9:
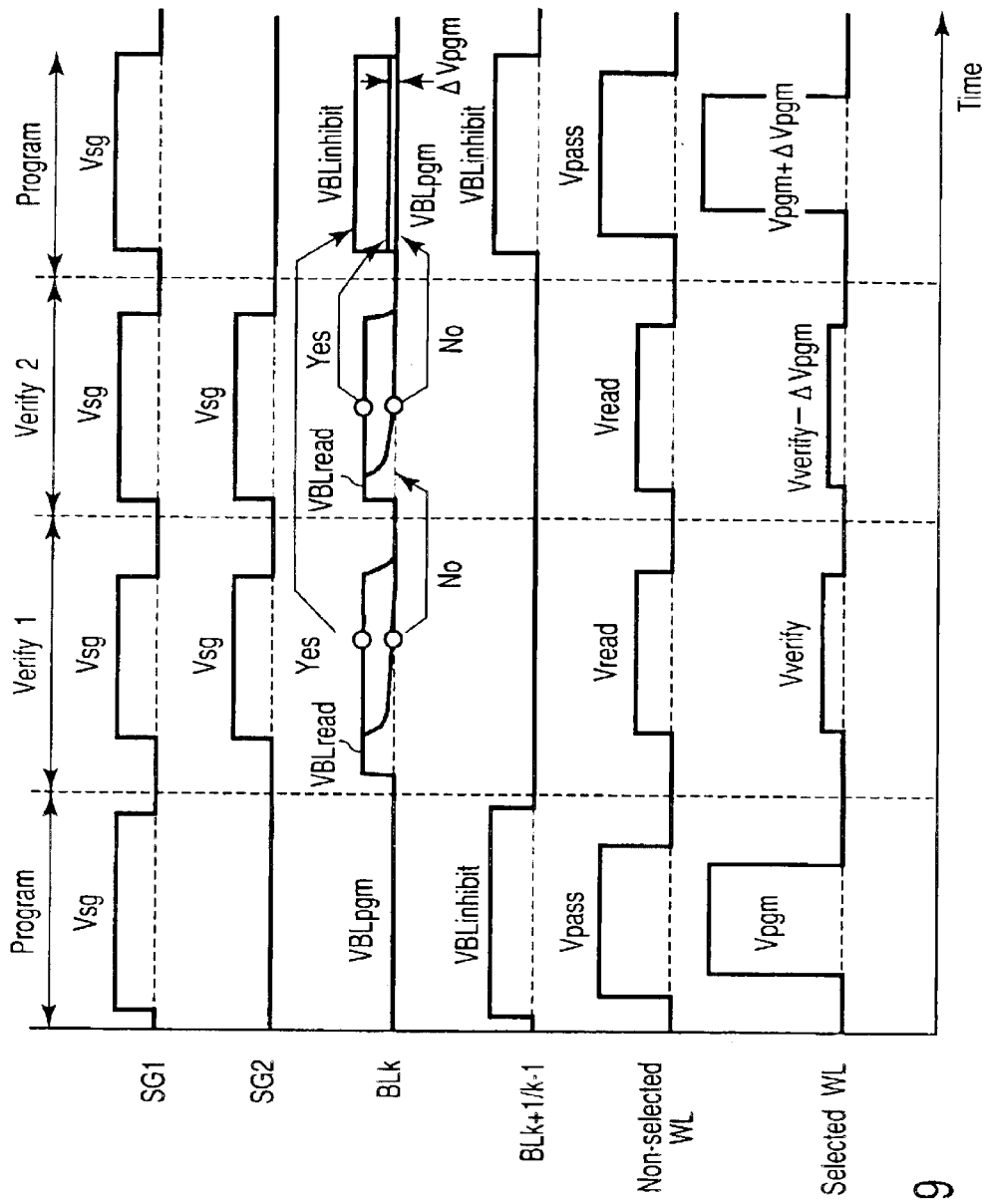
FIG. 9 is an operation waveform diagram showing a second example of the operation waveforms of the nonvolatile semiconductor memory device according to the first embodiment of this invention.

Examples of operation waveforms according to the potential control operation at the program operation time and the verify operation in the second example are shown in FIG. 9.

The following advantages can be attained according to the nonvolatile semiconductor memory device according to the first embodiment. Assume that time required for programming is Tpgm and time required for verifying is Tverify. Further, assume that the above times contain all of times required for actually generating operation pulses, for example, time required for stably setting potentials and time required for restoring nodes to which potentials are applied at the program operation time or verify operation time to the initial state. As shown in FIG. 10, when the typical example (conventional case) and the first embodiment (proposed case) are compared with each other, the number of program (write) operations performed until program potential is increased by ΔVpgm×2 is reduced by one time in the first embodiment. Therefore, time for increasing the program potential by ΔVpgm×2 is reduced by Tpgm in comparison with the case of the typical example. As a result, the high-speed program operation can be attained. Further, since the program suppression potential is set in order to perform the potential control operation at the program time, the controllable threshold voltage range is set not to ΔVpgm×2 but to ΔVpgm. Therefore, the control operation for the threshold voltage range can be performed with substantially the same high precision as in the case of the typical example. In addition, since the potential control operation is independently performed for each bit line BL, the threshold voltage distribution range control operation can be performed with high precision for each of the cell transistors.

The verify operation is explained more in detail below. The verify operation mainly contains five time periods, that is, word line potential setting time, bit line precharge time, bit line discharging time, bit line potential sense time and potential restoring time. In the operation waveform diagram of FIG. 9 corresponding to a second example of the verify operation, the verify operation contains two independent readout operations. However, the verify operation can also be performed as a series of readout operations to change only the word line potential after the elapse of the bit line potential sense time and additionally discharge the bit line by adequately setting the word line potential setting time and bit line discharging time. This is shown in FIG. 7 which is based on the first example of the verify operation. Therefore, in the first example of the verify operation, the numbers of bit line precharge times and potential restoring times can each be reduced by one time in comparison with the second example of the verify operation and the advantage that the higher speed operation can be performed can be obtained.

Further, in the program suppression state, only if the condition that the selection gate SG1 is sufficiently turned ON is satisfied, the bit line potential can be further raised. Therefore, for example, the following four states can be selected as the program state in a case where it is desired to increase the word line potential for every ΔVpgm×3 at the additional program time.

(i) Program State
  Bit line potential=VBLpgm
(ii) Program suppression state 1
  Bit line potential=VBLpgm+ΔVpgm
(iii) Program Suppression State 2
  Bit line potential=VBLpgm+ΔVpgm×2
(iv) Program Inhibition State
  Bit line potential=VBLinhibit In order to determine the four program states (i) to (iv), the three readout operations may be performed by using three potentials applied to the word line WL which are respectively set to (Vverify−ΔVpgm×2), (Vverify−ΔVpgm) and Vverify, for example. In this case, time for raising the program potential by ΔVpgm×3 can be reduced by Tpgm×2 in comparison with the case of the typical example while the controlled threshold voltage range is kept at substantially the same value as in the typical example case.

Likewise, when it is desired to increase the word line potential for every ΔVpgm×n at the additional program time, the following (n+1) states can be selected as the program state. In this case, n is an integer equal to or larger than "1".
(i) Program State
  Bit line potential=VBLpgm
(ii) Program suppression state 1
  Bit line potential=VBLpgm+ΔVpgm
(iii) Program Suppression State 2
  Bit line potential=VBLpgm+ΔVpgm×2
(n) Program Suppression State (n−1)
  Bit line potential=VBLpgm+ΔVpgm×(n−1)
(n+1) Program Inhibition State
  Bit line potential=VBLinhibit In order to determine the (n+1) program states (i) to (n+1), the n readout operations in total may be performed by using n potentials applied to the word line WL which are respectively set to (Vverify−ΔVpgm×(n−1)), (Vverify−ΔVpgm×(n−2)), . . . , (Vverify−ΔVpgm×2), (Vverify−ΔVpgm) and Vverify, for example. In this case, time for raising the program potential by ΔVpgm×n can be reduced by Tpgm×(n−1) in comparison with the case of the typical example while the controlled threshold voltage range is kept at substantially the same value as in the typical example case.

As described above, according to the first embodiment, in a memory in which discrete potentials can be set for the bit line at the program time, a high-speed program operation can be performed while suppressing a lowering in the control precision for the threshold voltage to a minimum by performing the verify readout operation which is adequately set for each case and determining the bit line potential at the next program time based on the result of the verify readout operation. Alternatively, the threshold voltage control precision can be enhanced while suppressing a lowering in the program speed to a minimum.

The upper limit of the bit line potential at the program time in the first embodiment is set on a condition that the selection gate SG1 is sufficiently turned ON. Therefore, when ΔVpgm is small, for example, when the threshold voltage control operation with high precision is required as in the multi-value memory, the advantage thereof can be more effectively attained.

In the first embodiment, a case wherein the minimum amount of a variation in the word line potential at the verify time is the same as the minimum amount of a variation in the bit line potential at the program time is explained. However, it is clearly understood that the threshold voltage control operation according to the present invention can be realized even when a verify method different from the above-described readout method is used if an adequate calibration method is defined and it is set in one-to-one correspondence to the threshold voltage which is suppressed by a rise in the bit line potential at the program time.

The threshold voltage of a selected cell can be detected by changing potential applied to the gate electrode of the selected cell in the verify operation. In addition, for example, the threshold voltage of a selected cell can be detected by changing at least one of determination reference time to determine the bit line potential, determination reference potential to determine the bit line potential, and initial charge potential applied to the bit line in the verify operation and then performing the verify readout operation two times or more. Further, the above verify methods can be variously combined.

For example, when it becomes necessary to use negative word line potential as verify potential, a method for performing the readout operation by applying positive bias to the common source line or the substrate in which the cell transistors are formed is generally used. However, in this case, a plurality of verify methods can be adequately combined based on the condition of the necessary word line potentials or the like.

Second Embodiment

Figure 11:
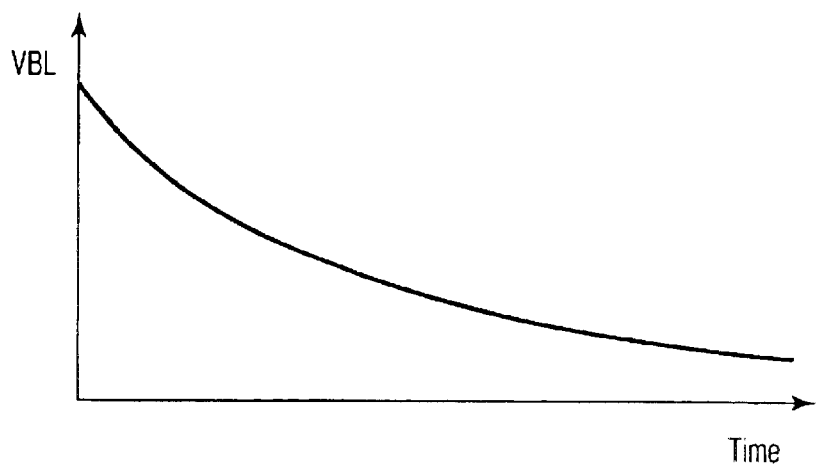
FIG. 11 is a diagram showing the relation between bit line potential VBL at the readout time and time.

FIG. 11 is a diagram showing the transition with time of a cell current flowing in a selected cell at the readout time. A selected bit line BL is raised to preset potential and a selection gate and non-selected word lines WL are turned ON. At this time, potential corresponding to threshold voltage which is required to be determined is applied to a selected word line WL. In the case of a verify operation, the lowest threshold voltage which the selected cell must satisfy, that is, Vverify may be applied in some cases. However, it is also possible to apply potential which can be used to calculate the threshold voltage of the selected cell with the highest precision based on the cell transistor characteristic or the like. When the threshold voltage of the selected cell is lower than Vverify, a cell current flows to lower the potential of the bit line. On the other hand, when the threshold voltage of the selected cell is higher than Vverify, no cell current flows and the bit line potential is kept at the high level. Even if the threshold voltage of the selected cell is lower than Vverify, a cell current decreases according to the current characteristic of the cell transistor as the threshold voltage of the selected cell comes nearer to Vverify. The transition of the bit line potential with time occurs based on a transition characteristic of discharging the bit line capacitor by use of a cell current. Therefore, the bit line potential is lowered in a shorter period of time as the cell current is larger and it takes a longer time for the bit line potential to be lowered as the cell current is smaller.

Figure 12:
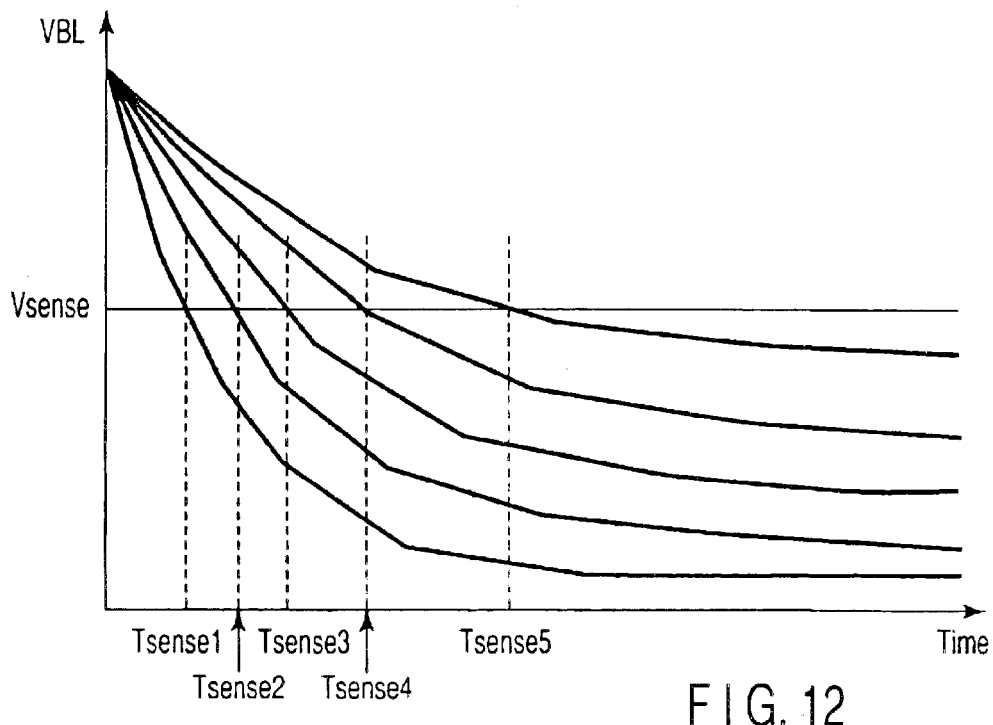
FIG. 12 is a diagram showing one example of a verify method which a nonvolatile semiconductor memory device according to a second embodiment of this invention performs.

The verify method using the above characteristic is shown in FIG. 12. FIG. 12 shows the transition of a cell current with time in a case where the threshold voltage is set to (Vverify−ΔVpgm×4), (Vverify−ΔVpgm×3), (Vverify−ΔVpgm×2), (Vverify−ΔVpgm×1), Vverify. A circuit which stores a period of time (discharge time) in which the bit line potential is lower than preset potential Vsense is connected to the bit line BL. Discharge times when the above threshold voltages are used are set to Tsense1, Tsense2, Tsense3, Tsense4, Tsense5. Since the cell current is set in one-to-one correspondence to the discharge characteristic of the bit line, it is possible to calculate the threshold voltage of the selected cell based on the discharge time. Therefore, the high-speed program operation can be performed while suppressing a reduction in the threshold voltage control precision to a minimum by detecting the discharge time and reflecting the same on the bit line potential at the program time. One example of a combination of the discharge time, the threshold voltage of the selected cell and the bit line potential at the program time is shown in Table 1.

TABLE 1

| Discharge time | Calculated threshold voltage | BL potential at program time | Threshold voltage after program |
|---|---|---|---|
| Tsense1 | Vverify − ΔVpgm × 4 | VBLpgm | Vverify |
| Tsense2 | Vverify − ΔVpgm × 3 | VBLpgm + ΔVpgm × 1 | Vverify |
| Tsense3 | Vverify − ΔVpgm × 2 | VBLpgm + ΔVpgm × 2 | Vverify |
| Tsense4 | Vverify − ΔVpgm × 1 | VBLpgm + ΔVpgm × 3 | Vverify |
| Tsense5 | Vverify | VBLinhibit | Vverify |

*For programming, potential which is higher than program potential used before the verify operation by ΔVpgm × 4 is used

TABLE 2

| BL potential after discharging | Calculated threshold voltage | BL potential at program time | Threshold voltage after program |
|---|---|---|---|
| Vsense1 | Vverify − ΔVpgm × 4 | VBLpgm | Vverify |
| Vsense2 | Vverify − ΔVpgm × 3 | VBLpgm + ΔVpgm × 1 | Vverify |
| Vsense3 | Vverify − ΔVpgm × 2 | VBLpgm + ΔVpgm × 2 | Vverify |
| Vsense4 | Vverify − ΔVpgm × 1 | VBLpgm + ΔVpgm × 3 | Vverify |
| Vsense5 | Vverify | VBLinhibit | Vverify |

Figure 13:
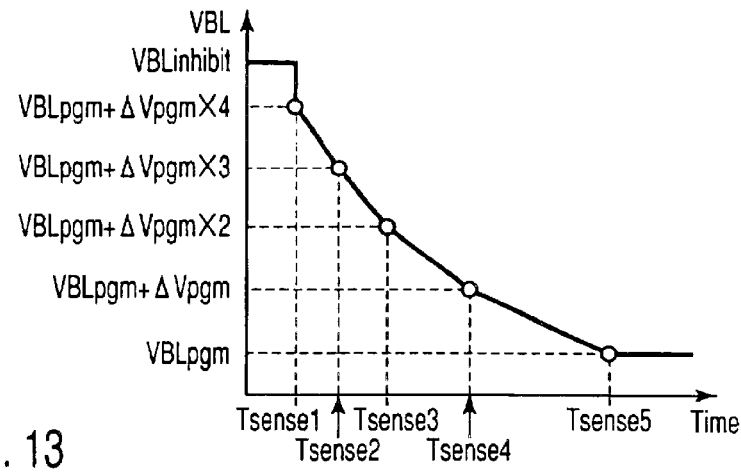
FIG. 13 is a diagram showing the relation between discharging time and bit line potential at the program time of the nonvolatile semiconductor memory device according to the second embodiment of this invention.

*For programming, potential which is higher than program potential used before the verify operation by ΔVpgm × 4 is used The relation between the discharge time in the second embodiment and the bit line potential at the program time is shown in FIG. 13. The example shown in Table 1 is indicated by circles in FIG. 13. If the discharge time is recorded by use of successive values and successive potentials are set as the bit line potential at the program time, the threshold voltage distribution range after the program operation can be set limitlessly closer to "0". The bit line potential at this time is defined by a straight line in FIG. 13. If the discharge time is shorter than Tsense1, the threshold voltage of the selected cell is excessively low so that VBLpgm will be applied to the bit line to set the program state. If the discharge time is longer than Tsense5, the threshold voltage of the selected cell exceeds Vverify so that VBLinhibit will be applied to the bit line to set the program inhibition state.

Third Embodiment

Figure 14:
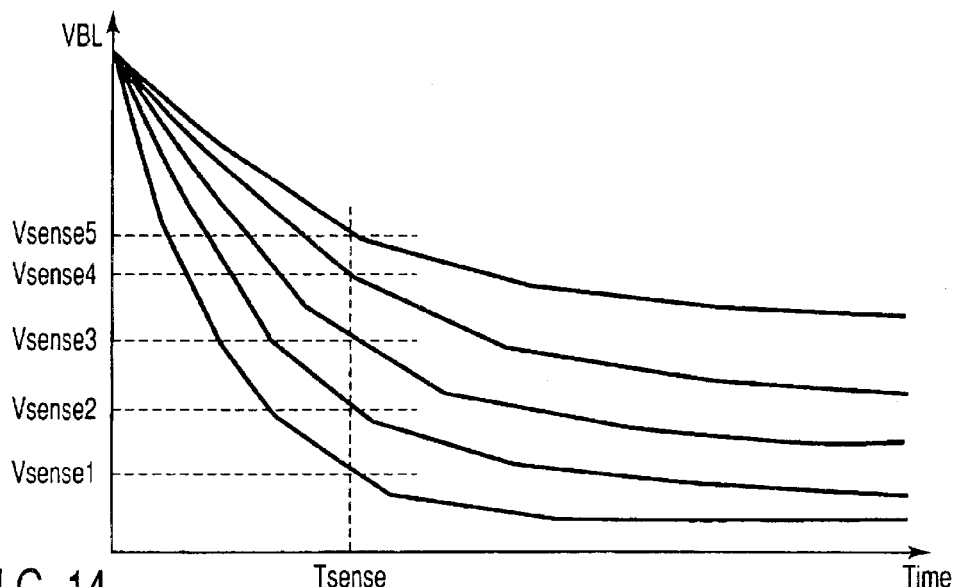
FIG. 14 is a diagram showing one example of a verify method which a nonvolatile semiconductor memory device according to a third embodiment of this invention performs.

A third embodiment utilizing another verify method is shown in FIG. 14. FIG. 14 is a diagram showing the transition with time of a cell current flowing in a selected cell at the readout time. The third embodiment is different from the second embodiment in the following point. In the second embodiment, the threshold voltage of the selected cell is detected based on a period of time in which the bit line potential reaches the preset potential Vsense in the verify operation. In the third embodiment, the threshold voltage of the selected cell is detected based on bit line potential when preset time Tsense has elapsed in the verify operation. FIG. 14 shows the transition of a cell current with time in a case where the threshold voltage is set to (Vverify−ΔVpgm×4), (Vverify−ΔVpgm×3), (Vverify−ΔVpgm×2), (Vverify−ΔVpgm×1), Vverify. A circuit which stores the bit line potential when the preset time Tsense has elapsed is connected to the bit line BL. Bit line potentials after discharging for the above respective threshold voltages are set to Vsense1, Vsense2, Vsense3, Vsense4, Vsense5. Since the cell current is set in one-to-one correspondence to the discharge characteristic of the bit line, it is possible to calculate the threshold voltage of the selected cell based on the bit line potential after discharging. Therefore, the high-speed program operation can be performed while suppressing a reduction in the threshold voltage control precision to a minimum by measuring the bit line potential after discharging and reflecting the same on the bit line potential at the program time. One example of a combination of the bit line potential after discharging, the threshold voltage of the selected cell and the bit line potential at the program time is shown in Table 2.

Figure 15:
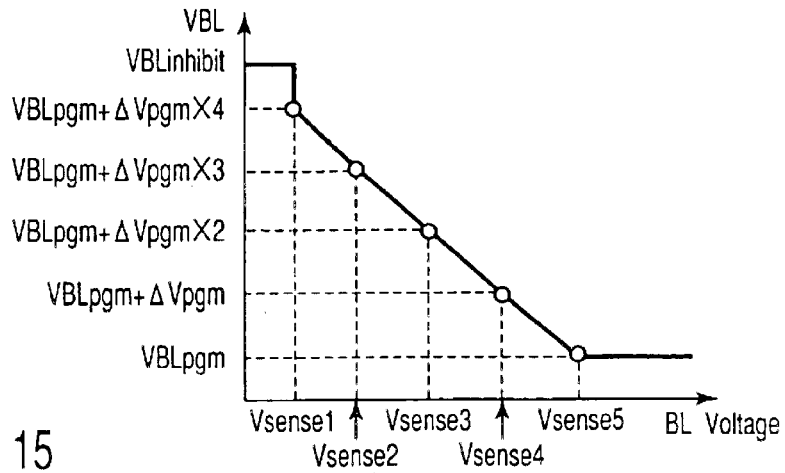
FIG. 15 is a diagram showing the relation between bit line potential at the program time of the nonvolatile semiconductor memory device according to the third embodiment of this invention and bit line potential after discharging.

The relation between the bit line potential after discharging in the third embodiment and the bit line potential at the program time is shown in FIG. 15. The example shown in Table 2 is indicated by circles in FIG. 15. If the bit line potential after discharging is recorded by use of successive values and successive potentials are set as the bit line potential at the program time, the threshold voltage distribution range after the program operation can be set limitlessly closer to "0". The bit line potential at this time is defined by a straight line in FIG. 15. If the bit line potential after discharging is lower than Vsense1, the threshold voltage of the selected cell is excessively low so that VBLpgm will be applied to the bit line to set the program state. If the bit line potential after discharging is higher than Vsense5, the threshold voltage of the selected cell exceeds Vverify so that VBLinhibit will be applied to the bit line to set the program inhibition state.

Fourth Embodiment

As a fourth embodiment, one example of the device configuration of a nonvolatile semiconductor memory device which can be applied to the first to third embodiments is explained below.

Figure 16:
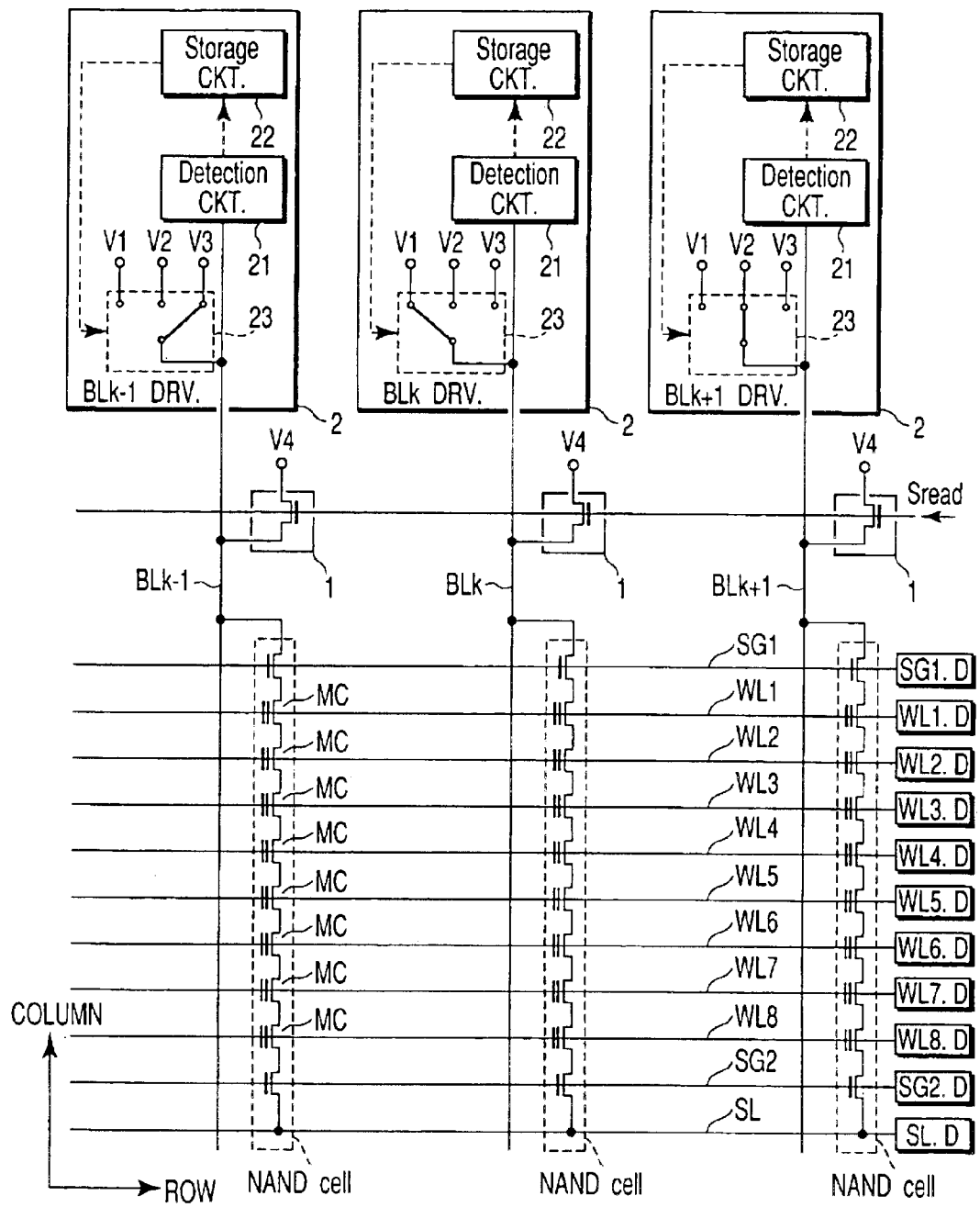
FIG. 16 is a block diagram showing a nonvolatile semiconductor memory device according to a fourth embodiment of this invention.

FIG. 16 is a block diagram showing a nonvolatile semiconductor memory device according to the fourth embodiment of this invention.

As shown in FIG. 16, a plurality of bit lines BL (BLk−1 to BL−k+1) are formed along respective columns. Memory cells each including nonvolatile memory cell transistors MC are connected to the respective bit lines BL. In this example, a NAND cell is used as one example of the memory cell. The gate electrodes of the cell transistors MC arranged on each row which intersects the column are commonly connected to a corresponding one of word lines WL (WL1 to WL8). The bit lines BL are respectively connected to charging circuits 1 which supply initial charging potentials, for example, readout potentials (VBLread) at the data readout time and bit line driving circuits 2. For example, the charging circuits 1 are each supplied with a readout control signal Sread. The charging circuit 1 charges the bit line BL to the initial charging potential according to the control signal Sread. Therefore, data items are simultaneously read out from the plurality of memory cells MC connected to one word line WL. The driving circuit 2 includes a detection circuit (detection CKT) 21, storage circuit (storage CKT) 22 and potential setting circuit 23. For example, the detection circuit 21 detects the threshold voltage of the cell transistor in the program verify operation. One concrete example of the detection circuit 21 is a sense amplifier. The storage circuit 22 stores the threshold voltage detected by the detection circuit 21. One concrete example of the storage circuit 22 is a data latch circuit. The storage circuit 22 stores the results of the verify readout operation which is performed two times or more in the case of the first embodiment, a period of time in which the potential of the bit line BL has reached the preset potential Vsense in the case of the second embodiment, and the potential of the bit line BL when the preset time Tsense has elapsed in the case of the third embodiment. Thus, the storage circuit 22 stores the threshold value of the selected cell. The potential setting circuit 23 sets the potential of the bit line BL to program inhibition potential VBLinhibit used to inhibit the data programming operation, program potential VBLpgm used to permit the data programming operation, and program suppression potential VBLpgm+ΔVpgm which has potential between VBLinhibit and VBLpgm and is used to program data while suppressing a program amount based on the threshold value stored in the storage circuit 22 in the program operation which follows the program verify operation. For example, if the nonvolatile semiconductor memory device is formed with the above configuration, the potential control operation and verify operation explained in the first to third embodiments can be realized. In FIG. 16, a state in which the bit line BLk−1 is set to VBLinhibit (V3), the bit line BLk is set to VBLpgm (V1), and the bit line BLk+1 is set to VBLpgm+ΔVpgm (V2) is shown.

Fifth Embodiment

Figure 17:
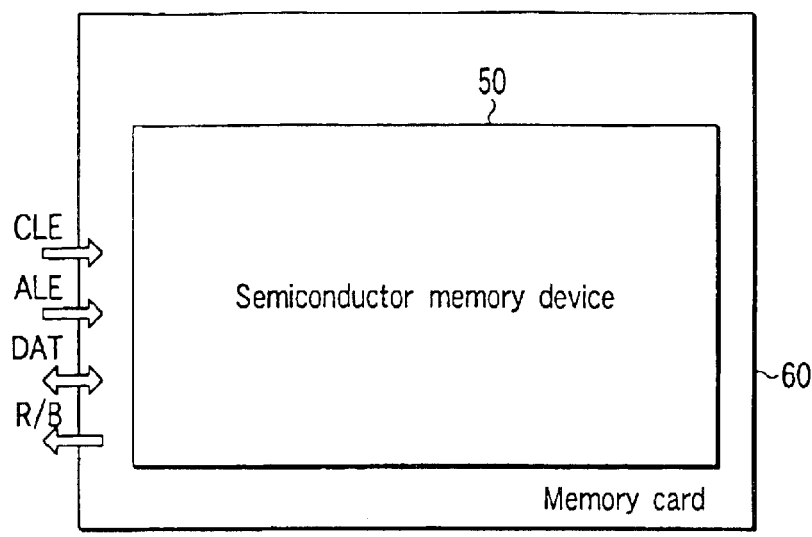
FIG. 17 is a block diagram showing an illustrative internal structure of a memory card in accordance with an embodiment of the present invention.

One application example in which the nonvolatile. semiconductor memory device explained in the above embodiment is used is explained as a fifth embodiment. In one example, shown in FIG. 17, a memory card 60 includes the semiconductor memory device 50. As shown in FIG. 17, the memory card 60 is operable to receive/output predetermined signals and data from/to an external device (not shown).

A signal line (DAT), a command line enable signal line (CLE), an address line enable signal line (ALE) and a ready/busy signal line (R/B) are connected to the memory card 60 having the semiconductor memory device 50. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device 50 is ready, or not.

Figure 18:
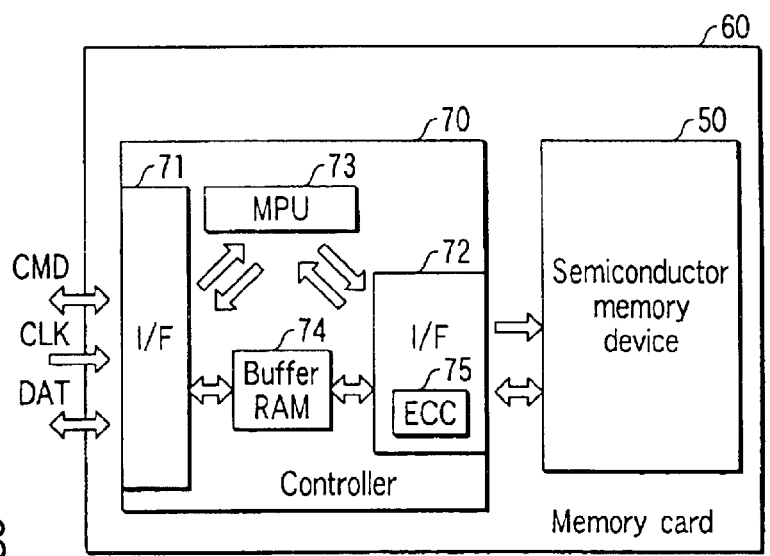
FIG. 18 is a block diagram showing an illustrative internal structure of a memory card in accordance with an embodiment of the present invention.

Another exemplary implementation is shown in FIG. 18. The memory card shown in FIG. 18 differs from the memory card presented in FIG. 17 in that the memory card 60 of FIG. 18 includes, in addition to the memory device 50, a controller 70 which controls the semiconductor memory device 50 and receives/transfers predetermined signals from/to an external device (not shown).

The controller 70 includes interface units (I/F) 71, 72, a microprocessor unit (MPU) 73, a buffer RAM 74 and an error correction code unit (ECC) 75. The interface unit (I/F) 71, 72 receives/outputs predetermined signals from/to an external device (not shown) and the semiconductor memory device 50, respectively. The microprocessor unit 73 converts a logical address into a physical address. The buffer RAM 74 stores data temporarily. The error correction code unit 75 generates an error correction code. A command signal line (CMD), a clock signal line (CLK) and a signal line (DAT) are connected to the memory card 60. It should be noted that the number of the control signal lines, bit width of the signal line (DAT) and a circuit construction of the controller 70 could be modified suitably.

Figure 19:
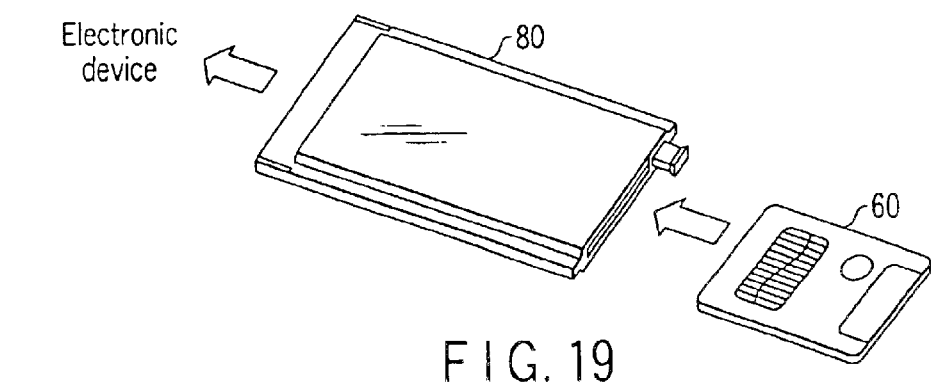
FIG. 19 is an illustrative example of cardholder and a memory card in accordance with an embodiment of the present invention.

Another exemplary implementation is shown in FIG. 19. As can be seen from FIG. 19, a memory cardholder 80 is provided for receiving a memory card 60 having a memory device 50. The cardholder 80 is connected to an electronic device (not shown) and is operable as an interface between the card 60 and the electronic device. The cardholder 80 may perform one or more of the functions of the controller 70 described in connection with FIG. 18.

Figure 20:
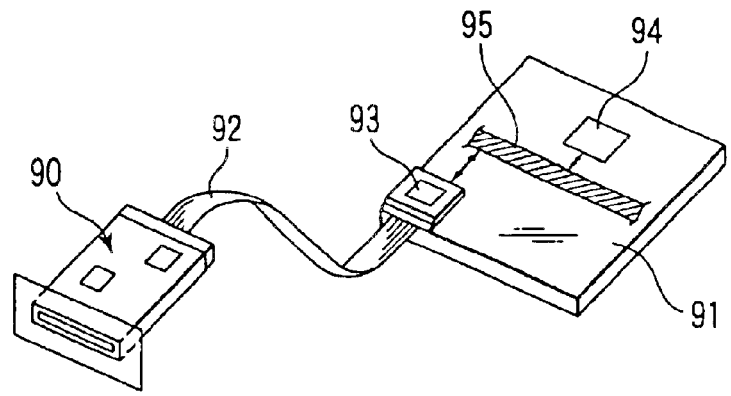
FIG. 20 shows a connecting apparatus operable to receive a memory card or cardholder.

Another exemplary implementation will be explained with reference to FIG. 20. FIG. 20 shows a connecting apparatus operable to receive a memory card or a cardholder, either of which includes the memory device. The memory card or cardholder is insertable in the connecting apparatus 90 and is electrically connectable to the apparatus. The connecting apparatus 90 is connected to a board 91 via a connecting wire 92 and an interface circuit 93. The board 91 contains a CPU (Central Processing Unit) 94 and a bus 95.

Figure 21:
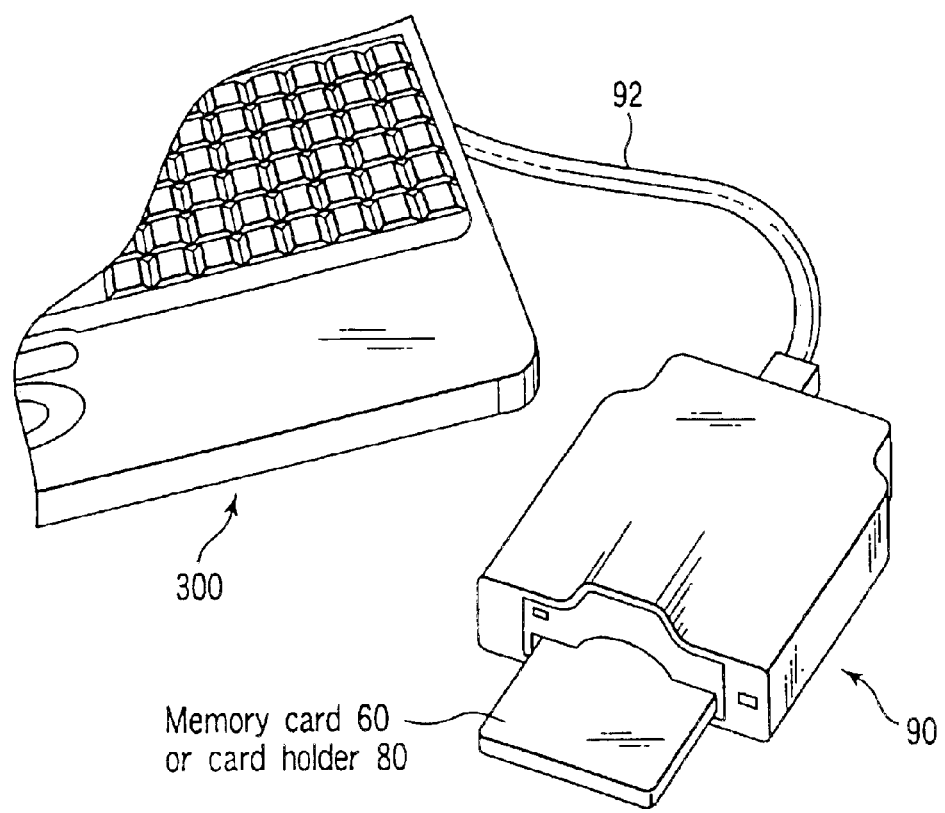
FIG. 21 is an illustrative example of a connecting apparatus connected to a personal computer via a connecting wire and having a memory card inserted therein.

Another exemplary implementation is shown in FIG. 21. As shown in FIG. 21, a memory card 60 or a cardholder 80, either of which includes the memory device, is inserted and electrically connectable to a connecting apparatus 90. The connecting apparatus 90 is connected to a PC (Personal Computer) 300 via connecting wire 92.

Figure 22:
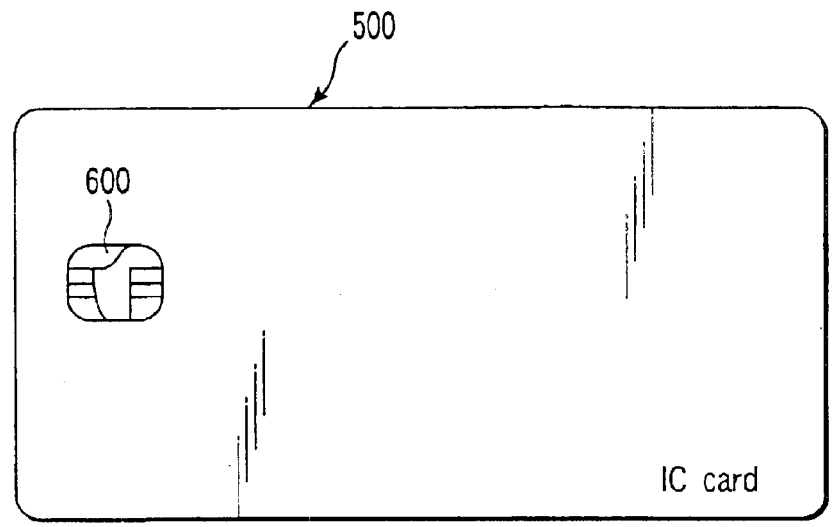
FIG. 22 shows an IC card in accordance with an embodiment of the present invention.
Figure 23:
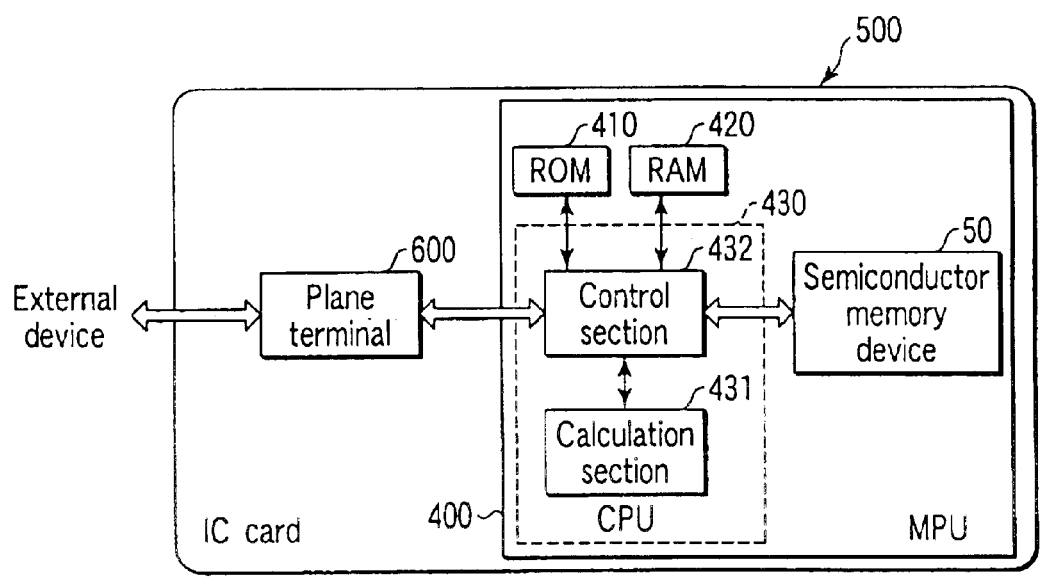
FIG. 23 is a block diagram of an IC card in accordance with an embodiment of the present invention.

Another exemplary implementation is shown in FIGS. 22 and 23. As shown in FIGS. 22 and 23, a semiconductor memory device 50 and other circuits such as ROM (read only memory) 410, RAM (random access memory) 420 and CPU (central processing unit) 430 are included in an IC (interface circuit) card 500. The IC card 500 is connectable to an external device via a plane terminal 600 that is coupled to an MPU (micro-processing unit) portion 400 of the card 450. The CPU 430 contains a calculation section 431 and a control section 432, the control section 432 being coupled to the memory device 50, the ROM 410 and the RAM 420. Preferably, the MPU 400 is molded on one surface of the card 500 and the plane connecting terminal 600 is formed on the other surface.

As described above, according to the nonvolatile semiconductor memory device of the above embodiments, the high-speed program operation can be performed without lowering the control precision of the threshold voltage of the memory cell by separately controlling the bit line potentials according to the result of the program verify operation.

Figure 24:
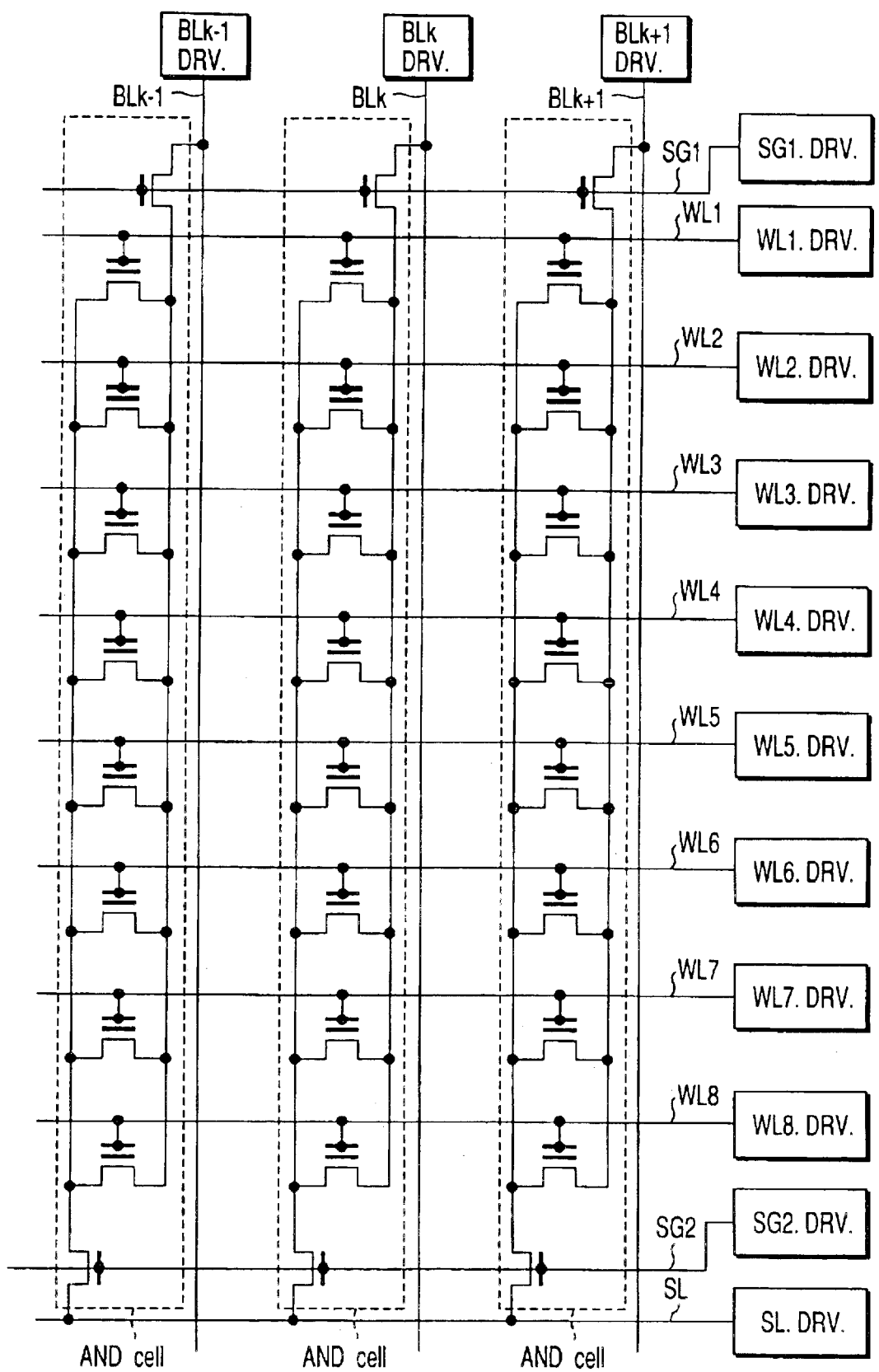
FIG. 24 is a block diagram showing a nonvolatile semiconductor memory device to which this invention can be applied.

Further, this invention is not limited to the above embodiments and can be variously modified without departing from the technical scope thereof when realizing the embodiments. For example, in the above embodiments, a NAND cell is used as an example of the memory cell, but the application of this invention is not limited to the NAND nonvolatile semiconductor memory device containing the NAND cells. For example, as shown in FIG. 24, this invention can be applied to an AND nonvolatile semiconductor memory device containing AND cells and a nonvolatile semiconductor memory device of a type other than the NAND type and AND type.

Further, the above embodiments can be independently realized, but it is also possible to adequately combine the embodiments.

Further, inventions of various stages are contained in the above embodiments and can be extracted by adequately combining a plurality of constituent elements disclosed in the respective embodiments.

In the above embodiments, a case wherein the present invention is applied to the nonvolatile semiconductor memory device is explained, but a semiconductor integrated circuit device such as a processor, system LSI which contains the nonvolatile semiconductor memory device can be included within the scope of this invention.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A nonvolatile semiconductor memory device comprising:
a plurality of wirings formed to extend in a first direction;
memory cells containing nonvolatile memory cell transistors and connected to the plurality of wirings;
word lines commonly connected to gate electrodes of the nonvolatile memory cell transistors arranged along a second direction which intersects the first direction; and
driving circuits respectively connected to the plurality of wirings, each of the driving circuits including a detection circuit which detects threshold voltage of the nonvolatile memory cell transistor in a verify operation, a storage circuit which stores threshold voltage detected by the detection circuit and a potential setting circuit which sets potential of the wiring to at least three potentials based on the threshold voltage stored in the storage circuit in a program operation following the verify operation.

2. The device according to claim 1, wherein the at least three potentials include program inhibition potential used to inhibit a data programming operation, program potential used to perform a data programming operation and program suppression potential which has potential between the program inhibition potential and the program potential and is used to program data while suppressing a program amount.

3. The device according to claim 2, wherein the threshold voltage of the nonvolatile memory cell transistor is detected by converting at least one of potential applied to the gate electrode of the nonvolatile memory cell transistor, initial charging potential applied to the wiring, determination reference potential to determine the potential of the wiring, and determination reference time to determine the potential of the wiring and performing the verify readout operation at least twice.

4. The device according to claim 3, wherein the storage circuit stores the results of the verify readout operation performed at least twice.

5. The device according to claim 2, wherein the threshold voltage of the nonvolatile memory cell transistor is detected based on time required for the potential of the wiring to reach preset potential in the verify operation.

6. The device according to claim 5, wherein the storage circuit stores time required for the potential of the wiring to have reached the preset potential.

7. The device according to claim 2, wherein the threshold voltage of the nonvolatile memory cell transistor is detected based on the potential of the wiring when preset time has elapsed in the verify operation.

8. The device according to claim 7, wherein the storage circuit stores the potential of the wiring set when the preset time has elapsed.

9. The device according to claim 2, wherein the at least three potentials are discrete values which are independently set.

10. The device according to claim 3, wherein the at least three potentials are discrete values which are independently set.

11. The device according to claim 5, wherein the at least three potentials are discrete values which are independently set.

12. The device according to claim 7, wherein the at least three potentials are discrete values which are independently set.

13. The device according to claim 2, wherein the program suppression potential is selected from successive values which lie between the program inhibition potential and the program potential based on the threshold voltage information and set to the selected value.

14. The device according to claim 5, wherein the program suppression potential is selected from successive values which lie between the program inhibition potential and the program potential based on the threshold voltage information and set to the selected value.

15. The device according to claim 7, wherein the program suppression potential is selected from successive values which lie between the program inhibition potential and the program potential based on the threshold voltage information and set to the selected value.

16. The device according to claim 1, wherein the memory cell is a NAND cell.

17. The device according to claim 1, wherein the memory cell is an AND cell.

18. A data programming method of a nonvolatile semiconductor memory device comprising:
programming data into a nonvolatile memory cell transistor,
verifying threshold voltage of the nonvolatile memory cell transistor into which data has been programmed,
setting potential of a bit line to program inhibition potential used to inhibit data programming if it is detected based on the result of verification that a sufficient amount of data has been programmed, and
setting the potential of the bit line to one of program potential used to program data according to the threshold voltage of the nonvolatile memory cell transistor and at least one program suppression potential which lies between the program inhibition potential and the program potential and is used to program data while suppressing a program amount and additionally programming data into the nonvolatile memory cell transistor if it is detected based on the result of verification that a sufficient amount of data has not been programmed.

19. The method according to claim 18, wherein word line potential is stepped up with respect to word line potential used at the data programming time before the verify operation when data is additionally programmed.

20. The method according to claim 19, wherein a stepped-up range of the word line potential is an integer multiple of a potential difference between the program potential and the program suppression potential.

21. The method according to claim 18, wherein the threshold voltage of the nonvolatile memory cell transistor is determined by setting the word line potential to potential different from verify potential and reading out data.

22. The method according to claim 21, wherein a potential difference between the verify potential and the potential different from the verify potential is equal to a potential difference between the program potential and the program suppression potential.

23. The method according to claim 18, wherein the threshold voltage of the nonvolatile memory cell transistor is determined based on a period of time in which potential of the bit line reaches preset potential from an initial charging potential after setting the potential of the bit line to the initial charging potential and reading out data.

24. The method according to claim 19, wherein the threshold voltage of the nonvolatile memory cell transistor is determined based on a period of time in which potential of the bit line reaches preset potential from an initial charging potential after setting the potential of the bit line to the initial charging potential and reading out data.

25. The method according to claim 20, wherein the threshold voltage of the nonvolatile memory cell transistor is determined based on a period of time in which potential of the bit line reaches preset potential from an initial charging potential after setting the potential of the bit line to the initial charging potential and reading out data.

26. The method according to claim 21, wherein the threshold voltage of the nonvolatile memory cell transistor is determined based on a period of time in which potential of the bit line reaches preset potential from an initial charging potential after setting the potential of the bit line to the initial charging potential and reading out data.

27. The method according to claim 22, wherein the threshold voltage of the nonvolatile memory cell transistor is determined based on a period of time in which potential of the bit line reaches preset potential from an initial charging potential after setting the potential of the bit line to the initial charging potential and reading out data.

28. The method according to claim 18, wherein the threshold voltage of the nonvolatile memory cell transistor is detected based on potential of the bit line when preset time has elapsed after setting the potential of the bit line to the initial charging potential and reading out data.

29. The method according to claim 19, wherein the threshold voltage of the nonvolatile memory cell transistor is detected based on potential of the bit line when preset time has elapsed after setting the potential of the bit line to the initial charging potential and reading out data.

30. The method according to claim 20, wherein the threshold voltage of the nonvolatile memory cell transistor is detected based on potential of the bit line when preset time has elapsed after setting the potential of the bit line to the initial charging potential and reading out data.

31. The method according to claim 21, wherein the threshold voltage of the nonvolatile memory cell transistor is detected based on potential of the bit line when preset time has elapsed after setting the potential of the bit line to the initial charging potential and reading out data.

32. The method according to claim 22, wherein the threshold voltage of the nonvolatile memory cell transistor is detected based on potential of the bit line when preset time has elapsed after setting the potential of the bit line to the initial charging potential and reading out data.

* * * * *